United States Patent
Tanaka

(10) Patent No.: US 9,879,176 B2
(45) Date of Patent: Jan. 30, 2018

(54) ORGANIC ELECTROLUMINESCENT ELEMENT, PRODUCTION METHOD FOR THE SAME, PLANAR LIGHT SOURCE, LIGHTING DEVICE, AND DISPLAY DEVICE

(75) Inventor: Shin-ya Tanaka, Tsukuba (JP)

(73) Assignee: SUMITOMO CHEMICAL COMPANY, LIMITED, Chuo-ku, Tokyo (JP)

(*) Notice: Subject to any disclaimer, the term of this patent is extended or adjusted under 35 U.S.C. 154(b) by 400 days.

(21) Appl. No.: 12/864,193

(22) PCT Filed: Jan. 21, 2009

(86) PCT No.: PCT/JP2009/051295
§ 371 (c)(1),
(2), (4) Date: Jul. 22, 2010

(87) PCT Pub. No.: WO2009/096397
PCT Pub. Date: Aug. 6, 2009

(65) Prior Publication Data
US 2010/0295085 A1    Nov. 25, 2010

(30) Foreign Application Priority Data
Jan. 30, 2008  (JP) ................. 2008-019032

(51) Int. Cl.
*H01L 27/15* (2006.01)
*C09K 11/06* (2006.01)
(Continued)

(52) U.S. Cl.
CPC .......... *C09K 11/06* (2013.01); *H01L 51/5036* (2013.01); *H05B 33/14* (2013.01)

(58) Field of Classification Search
CPC ................. H01L 33/60; H01L 33/20
See application file for complete search history.

(56) References Cited

U.S. PATENT DOCUMENTS

2004/0033388 A1   2/2004 Kim et al.
2004/0253756 A1  12/2004 Cok et al.
(Continued)

FOREIGN PATENT DOCUMENTS

| CN | 1574412 A | 2/2005 |
|----|-----------|--------|
| CN | 101060732 A | 10/2007 |

(Continued)

OTHER PUBLICATIONS

Machine generated English translation of JP 2004-006165 previously cited in an Information Disclosure Statement filed Jun. 3, 2002.
(Continued)

*Primary Examiner* — Jack Chen
(74) *Attorney, Agent, or Firm* — Sughrue Mion, PLLC

(57) ABSTRACT

An organic electroluminescent element comprising:
an anode;
a cathode; and
a light emitting unit arranged between the anode and the cathode and having three or more light emitting layers each containing a polymer compound, wherein the light emitting layers constituting the light emitting unit emit lights differing from each other in peak wavelength, and a light emitting layer that emits a light with a longer peak wavelength is located closer to the anode.

12 Claims, 1 Drawing Sheet

(51) Int. Cl.
*H01L 51/50* (2006.01)
*H05B 33/14* (2006.01)

(56) References Cited

U.S. PATENT DOCUMENTS

| 2005/0089716 | A1 | 4/2005 | Nakaya et al. | |
|---|---|---|---|---|
| 2006/0043885 | A1 | 3/2006 | Poplayskyy et al. | |
| 2006/0238113 | A1 | 10/2006 | Kashiwabara et al. | |
| 2007/0273273 | A1* | 11/2007 | Kim et al. | 313/504 |
| 2010/0165604 | A1 | 7/2010 | Uetani | |

FOREIGN PATENT DOCUMENTS

| CN | 101079472 A | 11/2007 |
|---|---|---|
| EP | 1 962 564 A1 | 8/2008 |
| JP | 07-220871 A | 8/1995 |
| JP | 2000-68057 A | 3/2000 |
| JP | 2004-006165 A | 1/2004 |
| JP | 2005-071735 A | 3/2005 |
| JP | 2007-318145 A | 12/2007 |
| WO | 2007/063897 A1 | 6/2007 |

OTHER PUBLICATIONS

Office Action dated May 8, 2012 in Japanese Patent Application No. 2008-019032, with English translation.
Extended European Search Report dated Apr. 23, 2012, in European Patent Application No. 09706823.3.
Office Action dated Nov. 2, 2011, in Chinese Patent Application No. 200980103206.4 with English translation.
Office Action dated Oct. 30, 2012 in Japanese Patent Application No. 2008-019032, with English translation.
Third Office Action dated Jun. 21, 2013 in corresponding Chinese Patent Application No. 200980103206.4 with English translation.

* cited by examiner

ORGANIC ELECTROLUMINESCENT ELEMENT, PRODUCTION METHOD FOR THE SAME, PLANAR LIGHT SOURCE, LIGHTING DEVICE, AND DISPLAY DEVICE

TECHNICAL FIELD

The present invention relates to an organic electroluminescent element, a production method for the same, a planar light source, a lighting device, and a display device.

BACKGROUND ART

An organic electroluminescent (abbreviated to EL) element including a pair of electrodes and a light emitting layer which is provided between the electrodes and contains a polymer compound has been known. In the organic EL element, the light emitting layer emits light when a voltage is applied to between the electrodes. For example, an organic EL element for emitting white light that includes a white light emitting layer in which a plurality of types of colorants are dispersed in a light emitting layer has been known (for example, JP-A-07-220871).

DISCLOSURE OF THE INVENTION

When the voltage to be applied to between the electrodes is changed, the color of light to be emitted is changed. In conventional organic EL elements, the change in color with respect to the change in applied voltage is large. Further, there is a demand for an organic EL element that emits light with high efficiency.

An object of the present invention is to provide an organic electroluminescent element that is reduced in a change in color with respect to a change in voltage applied to electrodes.

Another object of the present invention is to provide an organic electroluminescent element that emits light with high efficiency.

The present invention is an organic electroluminescent element comprising:
an anode;
a cathode; and
a light emitting unit arranged between the anode and the cathode and having three or more light emitting layers each containing a polymer compound, wherein
the light emitting layers constituting the light emitting unit emit lights differing from each other in peak wavelength, and a light emitting layer that emits a light with a longer peak wavelength is located closer to the anode.

The present invention is also the organic electroluminescent element, wherein the light emitting layers of the light emitting unit are composed of three layers of a light emitting layer capable of emitting red light, a light emitting layer capable of emitting green light, and a light emitting layer capable of emitting blue light.

The present invention is also the organic electroluminescent element, wherein the light emitting layers are formed one after another by applying coating liquids containing the materials to constitute the respective light emitting layers; and
a light emitting layer on whose surface a coating liquid is to be applied has been insolubilized against the coating liquid to be applied in advance of the application of the coating liquid.

The present invention is also the organic electroluminescent element, wherein at least part of the material to constitute the light emitting layer to be insolubilized is capable of being crosslinked by applying energy thereto.

The present invention is also the organic electroluminescent element, wherein a material to mainly constitute the light emitting layer to be insolubilized is capable of being crosslinked by applying energy thereto.

The present invention is also the organic electroluminescent element, wherein at least part of the material to constitute the light emitting layer to be insolubilized except the material to mainly constitute the light emitting layer is capable of being crosslinked by applying energy thereto.

The present invention is also the organic electroluminescent element, wherein
when a voltage to be applied to between the anode and the cathode is changed, the width of change of a coordinate value x and the width of change of a coordinate value y in a color coordinate of extracted light are 0.05 or less.

The present invention is also a planar light source comprising the organic electroluminescent element.

The present invention is also a lighting device comprising the organic electroluminescent element.

The present invention is also a display device comprising the organic electroluminescent element.

The present invention is also a production method for an organic electroluminescent element comprising an anode, a cathode, and a light emitting unit arranged between the anode and the cathode and having three or more light emitting layers each containing a polymer compound, the method comprising:
a step of forming the light emitting layers one after another by sequentially applying coating liquids containing the materials to constitute the respective light emitting layers in such a manner that a light emitting layer that emits a light with a longer peak wavelength is located closer to the anode in the light emitting unit, wherein
a light emitting layer on whose surface a coating liquid is to be applied is insolubilized against a coating liquid to be applied in advance of the application of the coating liquid in the step of sequentially forming the layers.

DESCRIPTION OF REFERENCE NUMERALS

Figure 1:
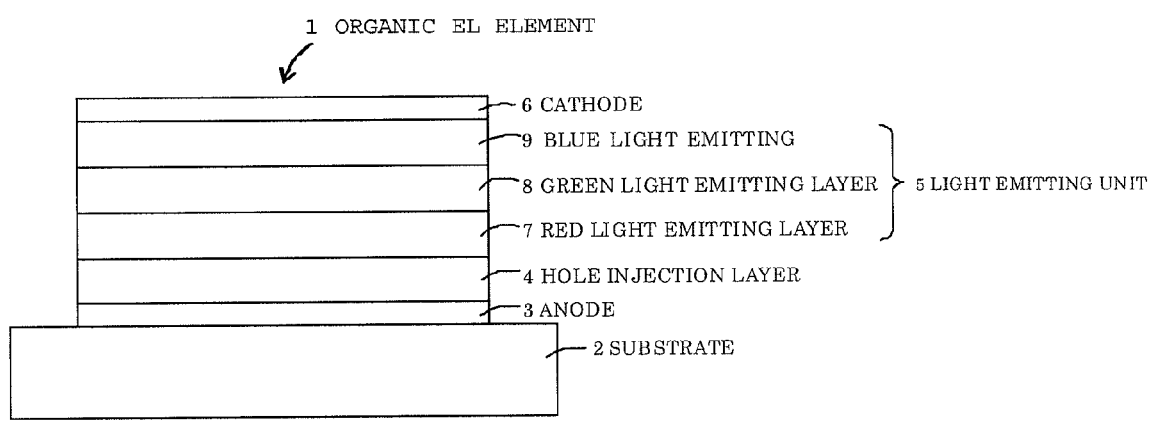
FIG. 1 is a front view showing an organic EL element 1 according to one embodiment of the present invention.

1: organic EL element
2: substrate
3: anode
4: hole injection layer
5: light emitting unit
6: cathode
7: red light emitting layer
8: green light emitting layer
9: blue light emitting layer

BEST MODE FOR CARRYING OUT THE INVENTION

An organic electroluminescent element (hereinafter referred to as organic EL element in some cases) of the present invention comprises an anode, a cathode, and a light emitting unit arranged between the anode and the cathode and having three or more light emitting layers each containing a polymer compound, wherein the light emitting layers constituting the light emitting unit emit lights differing from each other in peak wavelength, and a light emitting layer that emits a light with a longer wavelength is located closer the anode.

FIG. 1 is a front view showing an organic EL element 1 according to one embodiment of the present invention. The organic EL element 1 according to the present embodiment is constituted by laminating a substrate 2, an anode 3, a hole injection layer 4, a light emitting unit 5, and a cathode 6 in this order. The light emitting unit 5 is constituted by laminating a light emitting layer for emitting red light (hereinafter referred to as red light emitting layer in some cases) 7, a light emitting layer for emitting green light (hereinafter referred to as green light emitting layer in some cases) 8, and a light emitting layer for emitting blue light (hereinafter referred to as blue light emitting layer in some cases) 9 in this order. Since the peak wavelength of light emitted from the red light emitting layer 7 is the longest among those from the three light emitting layers 7, 8, and 9 constituting the light emitting unit 5, the red light emitting layer 7 is arranged closest to the anode 3 among the three light emitting layers 7, 8, and 9. Since the peak wavelength of light emitted from the green light emitting layer 8 is intermediate among those from the three light emitting layers 7, 8, and 9 constituting the light emitting unit 5, the green light emitting layer 8 is arranged at the center among the three light emitting layers 7, 8, and 9. Since the peak wavelength of light emitted from the blue light emitting layer 9 is the shortest among those from the three light emitting layers 7, 8, and 9 constituting the light emitting unit 5, the blue light emitting layer 9 is arranged closest to the cathode 6 among the three light emitting layers 7, 8, and 9. The peak wavelength of light emitted from a light emitting layer means the wavelength at which the highest light intensity is achieved when the light emitted therefrom is observed in a wavelength region.

As the red light emitting layer 7 in the present embodiment, used is one which emits light having a peak wavelength of, for example, 580 to 660 nm, preferably 600 to 640 nm. As the green light emitting layer 8 in the present embodiment, used is one which emits light having a peak wavelength of, for example, 500 to 560 nm, preferably 520 to 540 nm. As the blue light emitting layer 9 in the present embodiment, used is one which emits light having a peak wavelength of 400 to 500 nm, preferably, for example, 420 to 480 nm. Since white light is produced when overlapping the light emitted from each of the three light emitting layers 7, 8, and 9 each emitting the light at such a peak wavelength, the organic EL element 1 of the present embodiment in which the light emitting unit 5 is constituted by the red light emitting layer 7, the green light emitting layer 8, and the blue light emitting layer 9, emits the white light.

As the substrate 2, a rigid substrate or a flexible substrate may be used, and a glass plate, a plastic plate, a polymer film, a silicon plate, a laminated plate obtained by laminating the plates, or the like may suitably be used. In an organic El element of a so-called bottom emission type in which light from the light emitting unit 5 is easily extracted from the substrate 2 side, a substrate having high transmission of light in a visible light region may preferably be used as the substrate 2. In an organic El element of a so-called top emission type in which light from the light emitting unit 5 is easily extracted from the cathode 6 side, the substrate 2 may be transparent or non-transparent.

As the anode 3, an anode having low electric resistance is preferred. At least one of the anode 3 and the cathode 6 is transparent or translucent, and an anode which is transparent or translucent and has high transmission of light in a visible light region may preferably be used as the anode 3 in the bottom emission type organic EL element, for example. As a material for the anode 3, a metal oxide film having electroconductivity, an opaque metal thin film, or the like is usable. More specifically, as the anode 3, a thin film made from indium oxide, zinc oxide, tin oxide, indium tin oxide (abbreviated to ITO), or indium zinc oxide (abbreviated to IZO) and a thin film made from gold, platinum, silver or copper, or the like are usable. Among them, a thin film made from ITO, IZO, or tin oxide is suitably used as the anode 3. In the top emission type organic EL element, the anode 3 may preferably be formed from a material that reflects light from the light emitting unit 5 toward the cathode 6 side, and, for example, a metal thin film having a film thickness that allows light reflection may be used.

Examples of a production method for the anode 3 include vacuum vapor deposition method, sputtering method, ion plating method, plating method, and the like. Also, as the anode 3, an organic transparent electroconductive film of polyaniline or a derivative thereof, polythiophene or a derivative thereof, or the like may be used.

The hole injection layer 4 is a layer having a function of improving efficiency of hole injection from the anode 3. Examples of a hole injection material constituting the hole injection layer 4 include a phenyl amine-based material, a starburst type amine-based material, a phthalocyanine-based material, oxides such as vanadium oxide, molybdenum oxide, ruthenium oxide, and aluminum oxide, amorphous carbon, polyaniline, a polythiophene derivative, and the like.

The hole injection layer 4 can be obtained by film formation using, for example, a coating method of coating a coating liquid obtained by dissolving the hole injection material into a solvent. As the solvent, those capable of dissolving the hole injection material may be used, and examples thereof include water, chlorine-based solvents such as chloroform, methylene chloride, and dichloroethane, ether-based solvents such as tetrahydrofuran, aromatic hydrocarbon-based solvent such as toluene and xylene, ketone-based solvents such as acetone and methylethylketone, ester-based solvents such as ethyl acetate, butyl acetate, and ethyl cellosolve acetate, and the like.

Examples of the coating method for forming the hole injection layer 4 include spin coating method, casting method, micro-gravure coating method, gravure coating method, bar coating method, roll coating method, wire bar coating method, dip coating method, spray coating method, screen printing method, flexographic printing method, offset printing method, inkjet printing method, and the like. It is possible to form the hole injection layer 4 by applying the coating liquid to the substrate 2 on which the anode 3 has been formed by using one of the coating methods.

As a thickness of the hole injection layer 4, an optimum value varies depending on the material to be used, and is selected so as to attain an appropriate driving voltage and light emission efficiency. The hole injection layer 4 needs to have a thickness so that generation of a pin hole is at least prevented, while a too large thickness undesirably entails a high driving voltage of the element. Therefore, the film thickness of the hole injection layer 4 is, for example, 1 nm to 1 µm, preferably 2 to 500 nm, and more preferably 5 to 200 nm.

Each of the light emitting layers constituting the light emitting unit 5 is formed by a coating method in the present embodiment. Particularly in the present embodiment, a light emitting layer on whose surface a coating liquid containing materials constituting a light emitting layer to be film-formed is applied is insolubilized against the coating liquid to be applied before the coating liquid is applied. More specifically, the red light emitting layer 7 is insolubilized before forming a film for the green light emitting layer 8 by the coating method, and the green light emitting layer 8 is insolubilized before forming a film for the blue light emitting layer 9 by the coating method.

In the present embodiment, at least part of the material to constitute the light emitting layer to be insolubilized is capable of being crosslinked by applying energy thereto. After applying the coating liquid containing such materials and forming a film, the film can be insolubilized by applying light or heat as energy for crosslinking. A material to mainly constitute the light emitting layer to be insolubilized may be crosslinked by energy application, or, at least part of the material to constitute the light emitting layer to be insolubilized except the material to mainly constitute the light emitting layer may be crosslinked by energy application. In the latter case, a crosslinking agent for crosslinking when energy is applied is further added to the coating liquid in addition to the material mainly constituting the light emitting layer. In the case where the material mainly constituting the light emitting layer is crosslinked by energy application, it is unnecessary to add any crosslinking agent to the coating liquid. In the present embodiment, the material mainly constituting the light emitting layer is the material having the highest mass concentration in the light emitting layer, which corresponds to, for example, a fluorescent material and/or a phosphorescent material (hereinafter referred to as light emitting material in some cases) among the materials constituting the light emitting layer.

In the case of using a material that is capable of being crosslinked by energy application as the material to constitute mainly the light emitting layer, a polymer compound containing a group that is capable of being crosslinked by energy application (hereinafter referred to as crosslinking group) may be used. Examples of the crosslinking group include a vinyl group and the like. More specifically, examples of the material mainly constituting the light emitting layer include a material using a polymer compound containing at a main chain and/or a side chain a residue obtained by removing at least one hydrogen atom from benzocyclobutane (BCB).

Examples of the crosslinking agent that can be added to the coating liquid in addition to the material to mainly constitute the light emitting layer include a compound having a polymerizable substitution group selected from the group consisting of a vinyl group, an acetyl group, a butenyl group, an acryl group, an acrylamide group, a methacryl group, a methacrylamide group, a vinylether group, a vinylamino group, a silanol group, a cyclopropyl group, a cyclobutyl group, an epoxy group, an oxetane group, a diketene group, an episulfide group, a lactone group, and a lactam group. As the crosslinking agent, polyfunctional acrylate, for example, is preferred, and dipentaerythritol hexaacrylate (DPHA), trispentaerythritol octaacrylate (TPEA), and the like are more preferred.

Each of the light emitting layers 7, 8, and 9 contains an organic substance emitting fluorescent and/or phosphorescent light or the organic substance and a dopant. The dopant is added for the purpose of improving light emission efficiency or changing a light emission wavelength, for example. Examples of the light emitting material to mainly constitute each of the light emitting layers 7, 8, and 9 include a dye-based light emitting material, a metal complex-based light emitting material, and a polymer-based light emitting material.

Examples of the dye-based light emitting material include those obtainable by polymerizing a cyclopendamine derivative, a tetraphenylbutadiene derivative compound, a triphenylamine derivative, an oxadiazole derivative, a pyrazoloquinoline derivative, a distyrylbenzene derivative, a distyrylarylene derivative, a pyrrole derivative, a thiophene ring compound, a pyridine ring compound, a pelynone derivative, a perylene derivative, an oligothiophene derivative, a trifumanylamine derivative, an oxadiazole dimmer, a quinacridone derivative, a coumarin derivative, a pyrazoline dimmer, and the like.

Examples of the metal complex-based light emitting material include those obtainable by polymerizing a metal complex having a representative element such as Al, Zn, and Be, a rare earth metal (e.g., Tb, Eu, or Dy), or a transition element such as Ir and Pt as a center metal and having oxadiazole, thiadiazole, phenylpyridine, phenylbenzoimidazole, or a quinoline structure as a ligand, and examples thereof include those obtainable by polymerizing an iridium complex, a metal complex such as platinum complex emitting light from a triplet excited state, an alumiquinolinol complex, a benzoquinolinolberyllium complex, a benzooxazole zinc complex, a benzothiazole zinc complex, an azomethyl zinc complex, a porphyrin zinc complex, an europium complex, and the like.

Examples of the polymer-based light emitting material include a polyparaphenylenevinylene derivative, a polythiophene derivative, a polyparaphenylene derivative, a polysilane derivative, a polyacetylene derivative, a polyfluorene derivative, a polyvinylcarbazole derivative, and the like.

Among the above-described light emitting materials, examples of the light emitting material mainly constituting the red light emitting layer 7 include a coumarin derivative, a thiophene ring compound, polymers thereof, a polyparaphenylenevinylene derivative, a polythiophene derivative, a polyfluorene derivative, and the like, and a polyparaphenylenevinylene derivative, a polythiophene derivative, a polyfluorene derivative, and the like which are polymer-based materials are preferred.

Among the above-described light emitting materials, examples of the light emitting material mainly constituting the green light emitting layer 8 include a quinacridone derivative, a coumarin derivative, a thiophene ring compound, polymers thereof, a polyparaphenylenevinylene derivative, a polythiophene derivative, and the like, and a polyparaphenylenevinylene derivative, a polyfluorene derivative, and the like which are polymer-based materials are preferred.

Among the above-described light emitting materials, examples of the light emitting material mainly constituting the blue light emitting layer 9 include polymers of a distyrylarylene derivative and/or a oxadiazole derivative, a polyvinylcarbazole derivative, a polyparaphenylene derivative, a polyfluorene derivative, and the like, and a polyvinylcarbazole derivative, a polyparaphenylene derivative, a polyfluorene derivative, and the like which are polymer-based materials are preferred.

The light emitting material to mainly constitute each of the light emitting layers may further contain a dopant material for the purpose of improving light emitting efficiency, changing a light emission wavelength, or the like, in addition to the above-described material. Examples of the dopant material include a perylene derivative, a coumarin derivative, a rubrene derivative, a quinacridone derivative, a squarylium derivative, a porphyrin derivative, a styryl-based dye, a tetracene derivative, a pyrazolone derivative, decacyclene, phenoxazone, and the like.

It is possible to form each of the light emitting layers by the same method as the method for forming a film used for the hole injection layer 4 described above. More specifically, it is possible to form a film by coating a coating liquid obtained by dissolving the materials constituting the light emitting layer into the same solvent as that for dissolving the hole injection material by using the above-described coating method.

First, the film of the red light emitting layer 7 is formed. More specifically, the coating liquid obtained by dissolving the materials constituting the red light emitting layer 7 is applied to the surface of the anode 3 by the coating method. Subsequently, the coated film is heated or irradiated with light to obtain a crosslinked red light emitting layer 7. The crosslinked red light emitting layer 7 is not eluted even when the coating liquid for forming the green light emitting layer 8 is applied.

Next, the film of the green light emitting layer 8 is formed. More specifically, the coating liquid obtained by dissolving the materials constituting the green light emitting layer 8 is applied to the surface of the red light emitting layer 7 by the coating method. Subsequently, the coated film is heated or irradiated with light to obtain a crosslinked green light emitting layer 8. The crosslinked green light emitting layer 8 is not eluted even when the coating liquid for forming the blue light emitting layer 9 is applied.

Next, the film of the blue light emitting layer 9 is formed. More specifically, the coating liquid obtained by dissolving the materials constituting the blue light emitting layer 9 is applied to the surface of the green light emitting layer 8 by the coating method, and dried, thereby obtaining the blue light emitting layer 9.

By previously insolubilizing the light emitting layer to which the coating liquid is to be applied against the coating liquid as described above, it is possible to prevent the light emitting layers from being dissolved when the coating liquid is applied to the surface of the light emitting layer. Thus, control of the film thickness of each of the light emitting layers is facilitated, and it is possible to easily form the light emitting layers each having an intended film thickness.

For a layer thickness of each of the light emitting layers constituting the light emitting unit 5, preferably, the closer a light emitting layer is arranged to the anode 3, the thinner the layer thickness thereof is. More specifically, the layer thickness of the green light emitting layer 8 may preferably be larger than that of the red light emitting layer 7, and the layer thickness of the blue light emitting layer 9 may preferably be larger than that of the green light emitting layer 8. Further specifically, the layer thickness of the red light emitting layer 7 may be preferably 5 to 20 nm, and more preferably 10 to 15 nm. Also, the layer thickness of the green light emitting layer 8 may be preferably 10 to 30 nm, and more preferably 15 to 25 nm. Also, the layer thickness of the blue light emitting layer 9 may be preferably 40 to 70 nm, and more preferably 50 to 65 nm. By setting the layer thickness of each of the light emitting layers as described above, it is possible to realize the organic EL element 1 that is reduced in change in color with respect to a change in voltage applied to the electrodes, reduced in driving voltage, and capable of emitting light with high efficiency.

Since each of the light emitting layers constituting the light emitting unit is arranged in such a manner that a light emitting layer that emits a light with a longer wavelength is located closer to the anode 3, it is possible to realize the organic EL element 1 that is reduced in change in color with respect to a change in voltage applied to the electrodes, and reduced in driving voltage by setting the layer thickness of each of the light emitting layers. Since there is tendency that a highest occupied molecular orbital (abbreviated to HOMO) and a lowest unoccupied molecular orbital (abbreviated to LUMO) of the light emitting layer are lower along with the increase in peak wavelength of light emitted a light emitting layer with lower HOMO and LUMO is located closer to the anode 3 in the present embodiment. It is assumed that, since the light emitting layers are arranged in such a manner that the farther a light emitting layer is arranged to the anode 8, the higher HOMO and LUMO of the light emitting layer is, as described above, it is possible to efficiently transport holes and electrons in the light emitting unit 5, thereby making it possible to realize the organic EL element 1 that is reduced in change in color with respect to a change in voltage applied to the electrodes and reduced in driving voltage.

As a material for the cathode 6, a material that has a small work function, facilitates electron injection into the light emitting layer, and has high electroconductivity is preferred. Also, in the case of extracting light from the anode 3 side, a material having high visible light reflectance is preferred as the material for the cathode 6 in order to reflect the light from the light emitting unit 5 to the anode 3. As the material for the cathode 6, a metal such as an alkali metal, an alkali earth metal, a transition metal, and a metal of Group III-B are usable. More specifically, as the material for the cathode 6, a metal such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium, an alloy of two or more of the above-described metals, an alloy of one or more of the metals and one of gold, silver, platinum, copper, manganese, titanium, cobalt, nickel, tungsten, and lead, graphite, a graphite interlayer compound, and the like are usable. Examples of the alloys include a magnesium-silver alloy, a magnesium-indium alloy, a magnesium-aluminum alloy, an indium-silver alloy, a lithium-aluminum alloy, a lithium-magnesium alloy, a lithium-indium alloy, a calcium-aluminum alloy, and the like. Also, a transparent electroconductive electrode may be used as the cathode 6, and, for example, an electroconductive metal oxide, an electroconductive organic substance, and the like are usable. More specifically, indium oxide, zinc oxide, tin oxide, indium tin oxide (ITO), and indium zinc oxide (IZO), each of which is a complex thereof, are usable as the electroconductive metal oxide, and an organic transparent electroconductive film of polyaniline or a derivative thereof, polythiophene or a derivative thereof, or the like is usable as the electroconductive organic substance. The cathode may have a laminate structure including two or more layers.

In the organic EL element 1 of the above-described present embodiment, by arranging the light emitting layers 7, 8, and 9 constituting the light emitting unit 5 in such a manner that a light emitting layer with a longer peak wavelength is located closer to the anode, it is possible to realize the organic EL element 1 that is reduced in change in color with respect to a change in voltage applied to the electrodes, and capable of emitting light with high efficiency. In the organic EL element 1 having such configuration, it is possible to realize an organic EL element in which the width of change of a coordinate value x and the width of change of a coordinate value y in a color coordinate of extracted light when a voltage to be applied to between the anode and the cathode is changed is 0.05 or less. Here, the extracted light is light produced by overlapping the light from each of the light emitting layers 7, 8, and 9, and the color coordinate in the present embodiment is CIE1931 defined by the International Commission on Illumination (CIE).

In the organic EL element 1 of the above-described present embodiment, the light emitting unit 5 is constituted by laminating the light emitting layers 7, 8, and 9 and emits white light as a whole, but, for example, a light emitting unit for emitting light having a wavelength which is different from that of white light may be configured by providing light emitting layers each emitting light having a wavelength which is different from those from the light emitting layers 7, 8, and 9 of the present embodiment, and the light emitting unit may be formed of four or more light emitting layers. The color of light emitted from each of the light emitting layers is selected depending on a color of light extracted from each of the organic EL elements. Even in the cases where: the color of light extracted from the organic EL element is white color; the color is a color which is different from white color; a number of layers of the light emitting layers is three; and the number is four or more, it is possible to realize the organic EL element that is reduced in change in color with respect to a change in voltage applied to the electrodes, and capable of emitting light with high efficiency by arranging each of the light emitting layers in such a manner that a light emitting layer that emits a light with a longer peak wavelength is located closer to the anode.

The organic EL device 1 is usable for a planar light source, a lighting device, a display device, and the like. Examples of the display device that is provided with the organic EL element 1 include a segment display device, a dot matrix display device, a liquid crystal display device, and the like. In the dot matrix display device and the liquid crystal display device, the organic EL element 1 is used as a backlight. The organic EL element 1 of the present embodiment is suitably used for the above-described planar light source, lighting device, and display device, since the width of change of a coordinate value x and the width of change of a coordinate value y in a color coordinate of extracted light when a voltage applied to between the anode and the cathode is changed is 0.05 or less and a change in a color is small. Particularly, as the lighting device, since it is preferable to use a lighting device that is reduced in change in color and has width of change of each a coordinate value x and a coordinate value y of 0.05 or less in a color coordinate of light from the lighting device in the case of adjusting brightness by changing a voltage applied between an anode and a cathode, the organic EL element 1 of the present embodiment is suitably used for the lighting device. Likewise, as the backlight for the dot matrix display device and the liquid crystal display device, since it is preferable to use a backlight that is suppressed in change in color and has a variation width of each a coordinate value x and a coordinate value y of 0.05 or less in a color coordinate of light from the backlight in the case of adjusting brightness, the organic EL element 1 of the present embodiment is suitably used for the backlight.

In the organic EL element 1 of the above-described present embodiment, the light emitting unit 5 and the hole injection layer 4 are provided between the anode 3 and the cathode 6. However, the structure of layers to be provided between the anode 3 and the cathode 6 is not limited to the layer structure shown in FIG. 1. Between the anode and the cathode, it is sufficient that at least the light emitting unit is provided, and only the light emitting unit may be provided. Also, one or plurality of layers may be provided between the light emitting unit and the anode and/or the light emitting unit and the cathode.

Hereinafter, one example of the layer structure to be provided between the anode 3 and the cathode 6 will be described. In the following description, overlapping descriptions for the anode, the cathode, the light emitting unit, and the hole injection layer are omitted in some cases.

Examples of the layer to be provided between the cathode and the light emitting unit include an electron injection layer, an electron transport layer, a hole blocking layer, and the like. In the case where both of the electron injection layer and the electron transport layer are provided between the cathode and the light emitting unit, the layer positioned closer to the cathode is referred to as the electron injection layer, and the layer positioned closer to the light emitting unit is referred to as the electron transport layer.

The electron injection layer has a function of improving efficiency of electron injection from the cathode. The electron transport layer has a function of improving the electron injection from the cathode, the electron injection layer, or the electron transport layer that is closer to the cathode. The hole blocking layer has a function of blocking transport of holes. The electron injection layer or the electron transport layer is used also as the hole blocking layer in some cases.

Examples of the layer to be provided between the anode and the light emitting unit include the above-described hole injection layer, a hole transport layer, an electron blocking layer, and the like. In the case where both of the hole injection layer and the hole transport layer are provided between the anode and the light emitting unit, the layer positioned closer to the anode is referred to as the hole injection layer, and the layer positioned closer to the light emitting unit is referred to as the hole transport layer.

The hole injection layer has a function of improving efficiency of hole injection from the anode. The hole transport layer has a function of improving the hole injection from the anode or the hole injection layer, or the hole transport layer that is closer to the anode. The electron blocking layer has a function of blocking electron transport. The hole injection layer or the hole transport layer is used also as the electron blocking layer in some cases.

The electron injection layer and the hole injection layer are collectively referred to as a charge injection layer in some cases, and the electron transport layer and the hole transport layer are collectively referred to as a charge transport layer in some cases.

Specific examples of the layer structure of the organic EL element are listed below:

a) anode/hole transport layer/light emitting unit/cathode;
b) anode/light emitting unit/electron transport layer/cathode;
c) anode/hole transport layer/light emitting unit/electron transport layer/cathode;
d) anode/charge injection layer/light emitting unit/cathode;
e) anode/light emitting unit/charge injection layer/cathode;
f) anode/charge injection layer/light emitting unit/charge injection layer/cathode;
g) anode/charge injection layer/hole transport layer/light emitting unit/cathode;
h) anode/hole transport layer/light emitting unit/charge injection layer/cathode;
i) anode/charge injection layer/hole transport layer/light emitting unit/charge injection layer/cathode;
j) anode/charge injection layer/light emitting unit/charge transport layer/cathode;
k) anode/light emitting unit/electron transport layer/charge injection layer/cathode;
l) anode/charge injection layer/light emitting unit/charge transport layer/charge injection layer/cathode;
m) anode/charge injection layer/hole transport layer/light emitting unit/charge transport layer/cathode;
n) anode/hole transport layer/light emitting unit/charge transport layer/charge injection layer/cathode; and o) anode/charge injection layer/hole transport layer/light emitting unit/electron transport layer/charge injection layer/cathode.

(Here, the mark "/" is used for indicating that the two layers written before and after the mark "/" are laminated adjacent to each other. The same applies to the following description.)

In the bottom emission type organic El element in which the light is extracted from the substrate 2, each of the layers arranged closer to the substrate 2 than the light emitting unit is composed of a transparent or opaque layer. Also, in the so-called top emission type organic EL element in which light is extracted from the cathode 6 side, which is arranged at an opposite side to the substrate 2, each of the layers arranged closer to the cathode 6 than the light emitting unit is composed of a transparent or opaque layer.

The organic EL element may be provided with an insulating layer adjacent to the electrode and having a film thickness of 2 nm or less for enhancing adhesion with the electrode and improving the charge injection from the electrode, and, also, a thin buffer layer may be inserted between boundary faces of the adjacent layers for enhancing adhesion between and preventing mixing of the boundary faces and the like.

Hereinafter, a specific configuration of each of the layers will be described.

<Hole Transport Layer>

Examples of a hole transport material constituting a hole transport layer include polyvinylcarbazole or derivatives thereof, polysilane or derivatives thereof, a polysiloxane derivative having aromatic amine at a side chain or a main chain, a pyrazoline derivative, an arylamine derivative, a stilbene derivative, a triphenyldiamine derivative, polyaniline or derivatives thereof, polythiophene or derivatives thereof, polyarylamine or derivatives thereof, polypyrrole or derivatives thereof, poly(p-phenylenevinylene) or derivatives thereof, poly(2,5-thienylenevinylene) or derivatives thereof, and the like.

Among the hole transport materials, the polymer hole transport material such as polyvinylcarbazole or derivatives thereof, polysilane or derivatives thereof, polysiloxane derivative having an aromatic amine compound group at a side chain or a main chain, polyaniline or derivatives thereof, polythiophene or derivatives thereof, polyarylamine or derivatives thereof, poly(p-phenylenevinylene) or derivatives thereof, and poly(2,5-thienylenevinylene) or derivatives thereof may preferably be used as the hole transport material, more preferably polyvinylcarbazole or derivatives thereof, polysilane or derivatives thereof, polysiloxane derivative having aromatic amine at a side chain or a main chain, and the like. In the case of using a low molecular weight hole transport material, the low molecular weight hole transport material may preferably be dispersed into a polymer binder.

Examples of a method for forming a film of a hole transport layer include a method of forming a film from a mixed solution of the low molecular weight hole transport material with the polymer binder. Examples of a method of forming a film of a polymer hole transport material include a method of forming a film from a solution.

A solvent to be used in forming a film from a solution may be those capable of dissolving a hole transport material, and examples thereof include chlorine-based solvents such as chloroform, methylene chloride, and dichloroethane, ether-based solvents such as tetrahydrofuran, aromatic hydrocarbon-based solvents such as toluene and xylene, ketone-based solvents such as acetone and methylethylketone, and ester-based solvents such as ethyl acetate, butyl acetate, and ethyl cellsolve acetate.

Examples of the method of forming a film from a solution include the same coating methods as those exemplified as the method for forming a film of the hole injection layer 4.

As the polymer binder to be mixed, those which do not extremely inhibit charge transport are preferred, and those having weak visible light absorption are suitably used. Examples of the polymer binder include polycarbonate, polyacrylate, polymethyl acrylate, polymethylmethacrylate, polystyrene, polyvinyl chloride, polysiloxane, and the like.

An optimum value of a film thickness of a hole transport layer varies depending on the material to be used and is selected so as to attain an appropriate driving voltage and light emission efficiency. The hole transport layer needs to have a thickness so that generation of a pin hole is at least prevented, while a too large thickness undesirably entails a high driving voltage of the element. Therefore, the film thickness of the hole injection layer may be, for example, 1 nm to 1 μm, preferably 2 to 500 nm, and more preferably 5 to 200 nm.

<Charge Transport Layer>

Examples of an electron transport material constituting an electron transport layer include oxadiazole derivatives, anthraquino-dimethane or derivatives thereof, benzoquinone or derivatives thereof, naphthoquinone or derivatives thereof, anthraquinone or derivatives thereof, tetracyanoanthraquino-dimethane or derivatives thereof, fluorenone derivatives, diphenyldicyanoethylene or derivatives thereof, diphenoquinone derivatives, 8-hydroxyquinoline or metal complexes of derivatives thereof, polyquinoline or derivatives thereof, polyquinoxaline or derivatives thereof, and polyfluorene or derivatives thereof.

Among them, oxadiazole derivatives, benzoquinone or derivatives thereof, anthraquinone or derivatives thereof, 8-hydroxyquinoline or metal complexes of derivatives thereof, polyquinoline or derivatives thereof, polyquinoxaline or derivatives thereof, and polyfluorene or derivatives thereof may be preferably used, and 2-(4-biphenylyl)-5-(4-t-butylphenyl)-1,3,4-oxadiazole, benzoquinone, anthraquinone, tris(8-quinolinol)aluminum, and polyquinoline may be more preferably used.

Examples of a method of forming a film of an electron transport layer include a method of forming a film from a powder by vacuum vapor deposition and a method of forming a film from a solution or a molten state in the case of the low molecular weight electron transport material, and include a method of forming a film from a solution or from a molten state in the case of the polymer electron transport material. In forming a film from a solution or molten state, a polymer binder may be used in combination. Examples of the method of forming a film of the electron transport layer from a solution include the same methods as the above-described methods of forming a film of a hole transport layer from a solution.

An optimum value of a film thickness of an electron transport layer varies depending on the material to be used and is selected so as to attain an appropriate driving voltage and light emission efficiency. The electron transport layer needs to have a thickness so that generation of a pin hole is at least prevented, while a too large thickness undesirably entails a high driving voltage of the element. Therefore, the film thickness of the hole injection layer may be, for example, 1 nm to 1 μm, preferably 2 to 500 nm, and more preferably 5 to 200 nm.

<Electron Injection Layer>

Examples of an electron injection material constituting an electron injection layer include, depending on the type of the light emitting unit, an alkali metal, an alkali earth metal, an alloy containing one or more of the metals, oxides, halides, and carbonates of the metals, mixtures of these substances, and the like. Examples of the alkali metal or oxides, halides, and carbonates thereof include lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride, lithium carbonate, and the like. Examples of the alkali earth metal or oxides, halides, and carbonates thereof include magnesium, calcium, barium, strontium, magnesium oxide, magnesium fluoride, calcium oxide, calcium fluoride, barium oxide, barium fluoride, strontium oxide, strontium fluoride, magnesium carbonate, and the like. The electron injection layer may be a laminate that is obtained by laminating two or more layers. Specific examples of the laminate include LiF/Ca and the like. It is possible to form an electron injection layer by vapor deposition, sputtering, printing, or the like.

A film thickness of an electron injection layer may be preferably 1 nm to 1 µm.

The light emitting unit 5 in the present embodiment consists of a plurality of light emitting layers, and another layer that does not emit light may be inserted between the light emitting layers as another embodiment. Examples of the layer to be inserted between the light emitting layers include the above-described electron blocking layer, hole blocking layer, and the like.

In the light emitting unit of the present embodiment, the light emitting layers are formed in accordance with a descending order of light emission wavelengths, but the lamination order is not limited thereto. For example, the light emitting layers are formed in accordance with an ascending order of light emission wavelengths. Also, in the present embodiment, the anode is arranged closer to the substrate than the light emitting unit, and the cathode is arranged closer to the side opposite to the substrate than the light emitting unit. However, the arrangement of the anode and the cathode may be exchanged with respect to the substrate, or an organic EL element that is not provided with the substrate may be formed as another embodiment.

EXAMPLES

<Production of Organic EL Element>

The organic EL element shown in FIG. 1 was produced as Example. A glass substrate was used as the substrate 2, and an ITO film formed on the glass substrate by sputtering and patterned in a predetermined shape was used as the anode 3. As the anode 3, one having a thickness of 150 nm was used. The substrate 2 on which the anode 3 was formed was cleaned by using an alkaline detergent and ultrapure water, and dried, and then a UV-$O_3$ treatment was performed by using a UV-$O_3$ device (manufactured by Technovision, Inc.; Trade name "Model 312 UV-$O_3$ Cleaning System").

Next, a suspension of poly(3,4)ethylenedioxythiophene/polystyrenesulfonic acid (produced by HC Starck-VTech; trade name "BaytronP TP AI4083") was filtrated by using a membrane filter having a pore size of 0.2 µm. The liquid obtained by the filtration was spin-coated to form a thin film on the anode 3. Subsequently, the hole injection layer 4 having a film thickness of 70 nm was obtained by performing a heat treatment at 200° C. for 10 minutes on a hot plate.

Next, the red light emitting layer 7 was laminated on the hole injection layer 4. First, a coating liquid was prepared by using xylene as a solvent, using a light emitting material (produced by Sumation; trade name "PR158") as a material for mainly constituting the red light emitting layer 7, and using dipentaerythritol hexaacrylate as a crosslinking agent (produced by Nippon Kayaku Co., Ltd.; trade name "KAYARAD DPHA"). A weight ratio between the light emitting material and the crosslinking agent was 4:1, and a ratio of the material obtained by mixing the light emitting material and the crosslinking agent in the coating liquid was 1.0% by mass. The coating liquid thus obtained was spin-coated to form a thin film on the hole injection layer 4. Then, the red light emitting layer 7 having a film thickness of 10 nm was obtained by heating at 200° C. for 20 minutes under a nitrogen atmosphere. The heat treatment was performed for drying the thin film and eliminating the solvent as well as for crosslinking the crosslinking agent so that the red light emitting layer 7 was insolubilized against a coating liquid to be applied subsequently.

Next, the green light emitting layer 8 was laminated on the red light emitting layer 7. First, a coating liquid was prepared by using xylene as a solvent, using a light emitting material (produced by Sumation; trade name "Green1300") as a material for mainly constituting the green light emitting layer 8, and using dipentaerythritol hexaacrylate as a crosslinking agent (produced by Nippon Kayaku Co., Ltd.; trade name "KAYARAD DPHA"). A weight ratio between the light emitting material and the crosslinking agent was 4:1, and a ratio of the material obtained by mixing the light emitting material and the crosslinking agent in the coating liquid was 1.0% by mass. The coating liquid thus obtained was spin-coated to form a thin film on the red light emitting layer 7. Then, the green light emitting layer 8 having a film thickness of 15 nm was obtained by heating at 200° C. for 20 minutes under a nitrogen atmosphere. The heat treatment was performed for drying the thin film and eliminating the solvent as well as for crosslinking the crosslinking agent so that the green light emitting layer 8 was insolubilized against a coating liquid to be applied subsequently.

Next, the blue light emitting layer 9 was laminated on the green light emitting layer 8. First, a coating liquid was prepared by using xylene as a solvent and using a light emitting material (produced by Sumation; trade name "BP361") as a material for mainly constituting the blue light emitting layer 9. A ratio of the blue light emitting material in the coating liquid was 1.5% by mass. The coating liquid thus obtained was spin-coated to form a thin film on the green light emitting layer 8. Then, the blue light emitting layer 9 having a film thickness of 55 nm was obtained by heating at 130° C. for 20 minutes under a nitrogen atmosphere. A shape of a section obtained by cutting at a plane perpendicular to a thickness direction of each of the light emitting layers was a square of 2 mm×2 mm.

Next, a thin film of barium having a film thickness of about 5 nm was formed by introducing the substrate on which a film of the blue light emitting layer 9 was formed into a vacuum vapor deposition apparatus and depositing barium on the blue light emitting layer 9, and a thin film of aluminum having a film thickness of about 80 nm was formed by depositing aluminum on the thin film of barium, thereby forming the cathode 6 composed of a laminate of the thin film of barium and the thin film of aluminum. The deposition of barium and aluminum were started after a vacuum degree reached to $5 \times 10^{-5}$ Pa or less.

Comparative Example 1

<Production of Organic EL Element>

As Comparative Example 1, an organic EL element provided with a light emitting unit composed only of a light emitting layer (hereinafter referred to as white light emitting layer in some cases) emitting light in a white wavelength region was produced. Since production steps other than that for the white light emitting layer are the same as those of the organic EL element production steps of Example, the overlapping description is omitted, and only the production step for the white light emitting layer will be described.

First, a coating liquid was prepared by using xylene as a solvent and using a light emitting material (produced by Sumation; trade name "WP1330") as a material for mainly constituting the white light emitting layer. A ratio of the light emitting material in the coating liquid was 1.0% by mass. The coating liquid thus obtained was spin-coated on the substrate on which the hole injection layer 4 had been formed to form a thin film on the hole injection layer 4. Then, the white light emitting layer having a film thickness of 80 nm was obtained by heating at 130° C. for 20 minutes under a nitrogen atmosphere.

Comparative Example 2

<Production of organic EL Element>

As Comparative Example 2, an organic EL element in which only a lamination order of the three layers of the red light emitting layer, the green light emitting layer, and the blue light emitting layer is different from that of the organic EL element of Example was produced. The blue light emitting layer was arranged as the layer closest to the anode; the green light emitting layer was arranged as the intermediate layer; and the red light emitting layer was arranged as the layer closest to the cathode. Since production steps other than those for the red light emitting layer, the green light emitting layer, and the blue light emitting layer are the same as those of the organic EL element production steps of Example, only the production steps for the red light emitting layer, the green light emitting layer, and the blue light emitting layer will be described.

First, the blue light emitting layer 9 was laminated on the hole injection layer 4. A coating liquid was prepared by using xylene as a solvent, using a light emitting material (produced by Sumation; trade name "BP361") as a material for mainly constituting the blue light emitting layer 9, and using dipentaerythritol hexaacrylate as a crosslinking agent (produced by Nippon Kayaku Co., Ltd.; trade name "KAYARAD DPHA"). A weight ratio between the light emitting material and the crosslinking agent was 4:1, and a ratio of the material obtained by mixing the light emitting material and the crosslinking agent in the coating liquid was 1.0% by mass. The coating liquid thus obtained was spin-coated to form a thin film on the hole injection layer 4. Then, the blue light emitting layer 9 having a film thickness of 55 nm was obtained by heating at 130° C. for 20 minutes under a nitrogen atmosphere. The heat treatment was performed for drying the thin film and eliminating the solvent as well as for crosslinking the crosslinking agent so that the blue light emitting layer 9 was insolubilized against a coating liquid to be applied subsequently.

Next, the green light emitting layer 8 was laminated on the blue light emitting layer 9. First, a coating liquid was prepared by using xylene as a solvent, using a light emitting material (produced by Sumation; trade name "Green1300") as a material for mainly constituting the green light emitting layer 8, and using dipentaerythritol hexaacrylate as a crosslinking agent (produced by Nippon Kayaku Co., Ltd.; trade name "KAYARAD DPHA"). A weight ratio between the light emitting material and the crosslinking agent was 4:1, and a ratio of the material obtained by mixing the light emitting material and the crosslinking agent in the coating liquid was 1.0% by mass. The coating liquid thus obtained was spin-coated to form a thin film on the blue light emitting layer 9. Then, the green light emitting layer 8 having a film thickness of 15 nm was obtained by heating at 200° C. for 20 minutes under a nitrogen atmosphere. The heat treatment was performed for drying the thin film and eliminating the solvent as well as for crosslinking the crosslinking agent so that the green light emitting layer 8 was insolubilized against a coating liquid to be applied subsequently.

Next, the red light emitting layer 7 was laminated on the green light emitting layer 8. First, a coating liquid was prepared by using xylene as a solvent and using a light emitting material (produced by Sumation; trade name "PR158") as a material for mainly constituting the red light emitting layer 7. A ratio of the light emitting material in the coating liquid was 1.0% by mass. The coating liquid thus obtained was spin-coated to form a thin film on the green light emitting layer 8. Then, the red light emitting layer 7 having a film thickness of 10 nm was obtained by heating at 200° C. for 20 minutes under a nitrogen atmosphere.

A voltage was applied to each of the organic EL elements of Example, Comparative Example 1, and Comparative Example 2 to measure brightness and chromaticity. In the measurement, the voltage to be applied was changed stepwise, and brightness and chromaticity at each of the applied voltages were measured. The measurement results are shown in Table 1.

TABLE 1

| | maximum value of current efficiency | chromaticity of light emission at brightness (x, y) | | |
|---|---|---|---|---|
| | | 100 cd/m$^2$ | 1000 cd/m$^2$ | 10000 cd/m$^2$ |
| Example | 7.67 cd/a | (0.349, 0.398) | (0.340, 0.405) | (0.333, 0.408) |
| Comparative Example 1 | 4.53 cd/a | (0.367, 0.288) | (0.324, 0.276) | (0.293, 0.272) |
| Comparative Example 2 | 2.84 cd/a | (0.407, 0.322) | (0.357, 0.308) | (0.288, 0.301) |

Widths of change of coordinate values x and y in the CIE chromaticity coordinate of each of the organic EL elements of Example, Comparative Example 1, and Comparative Example 2 are shown in Table 2 when the brightness was changed from 100 cd/m$^2$ to 10000 cd/m$^2$ by changing the applied voltage.

TABLE 2

| | widths of changes of coordinate values x and y in CIE chromaticity coordinate | |
|---|---|---|
| | x | y |
| Example | 0.016 | 0.010 |
| Comparative Example 1 | 0.074 | 0.016 |
| Comparative Example 2 | 0.119 | 0.021 |

As shown in Table 1 and Table 2, in the organic EL element of Example 1, the variation width of each of the coordinate value x and the coordinate value y in the chromaticity coordinate of the light extracted when the brightness was changed from 100 cd/m² to 10000 cd/m² by changing the applied voltage was 0.016 or less.

As shown in Table 1, the maximum value of current efficiency of the organic EL element of Example 1 was improved by providing the three layers of the light emitting layers as compared to the organic EL element of Comparative Example 1 that was composed of the single layer of the light emitting layer.

Also, the maximum value of current efficiency of the organic EL element of Example 1 was improved by disposing the three layers of the light emitting layers at the predetermined arrangement as compared to the organic EL element of Comparative Example 2.

Also, as shown in Table 2, the change in color with respect to the change in voltage in the organic EL element of Example 1 was suppressed by providing the three layers of the light emitting layers as compared to the organic EL element of Comparative Example 1 that was composed of the single layer of the light emitting layer. Also, the change in color with respect to the change in voltage in the organic EL element of Example 1 was suppressed by disposing the three layers of the light emitting layers at the predetermined arrangement as compared to the organic EL element of Comparative Example 2.

INDUSTRIAL APPLICABILITY

According to the present invention, it is possible to realize an organic electroluminescent element that is reduced in change in color with respect to a change in voltage applied to the electrodes, and capable of emitting light with high efficiency by arranging light emitting layers in a predetermined order in accordance with peak wavelengths of light emitted.

Also, according to the present invention, it is possible to laminate the light emitting layers each having an intended film thickness by insolubilizing each of the light emitting layers against a coating liquid to be applied on its surface, thereby making it possible to easily produce the organic electroluminescent element by a coating method.

The invention claimed is:

1. An organic electroluminescent element comprising:
an anode;
a cathode; and
a light emitting unit arranged between the anode and the cathode and having three or more light emitting layers each containing a polymer compound, wherein
the light emitting layers constituting the light emitting unit emit lights differing from each other in peak wavelength, and a light emitting layer that emits a light with a longer peak wavelength having a lower value such that a minus sign is attached to the absolute value of highest occupied molecular orbital and a lower value such that a minus sign is attached to the absolute value of lowest unoccupied molecular orbital is located closer to the anode than the remaining light emitting layers of the light emitting unit, wherein
for a layer thickness of each of the light emitting layers constituting the light emitting layer unit, the closer a light emitting layer is arranged to the anode, the thinner the layer thickness thereof is.

2. The organic electroluminescent element according to claim 1, wherein
the light emitting layers of the light emitting unit are composed of three layers of a light emitting layer capable of emitting red light, a light emitting layer capable of emitting green light, and a light emitting layer capable of emitting blue light.

3. The organic electroluminescent element according to claim 1, wherein
a material to mainly constitute the light emitting layer is capable of being crosslinked by applying energy thereto.

4. The organic electroluminescent element according to claim 1, wherein
at least part of the material to constitute the light emitting layer except the material to mainly constitute the light emitting layer is capable of being crosslinked by applying energy thereto.

5. The organic electroluminescent element according to claim 1, wherein
when a voltage applied to between the anode and the cathode is changed, the width of change of a coordinate value x and the width of change of a coordinate value y in a color coordinate of extracted light are 0.05 or less.

6. A planar light source comprising the organic electroluminescent element defined in claim 1.

7. A lighting device comprising the organic electroluminescent element defined in claim 1.

8. A display device comprising the organic electroluminescent element defined in claim 1.

9. The organic electroluminescent element according to claim 1, wherein
the light emitting layers are formed one after another by applying coating liquids containing the materials to constitute the respective light emitting layers; and
a light emitting layer on whose surface a coating liquid is applied has been insolubilized against the coating liquid applied in advance of the application of the coating liquid.

10. The organic electroluminescent element according to claim 9, wherein
at least part of the material to constitute the light emitting layer is capable of being crosslinked by applying energy thereto.

11. An organic electroluminescent element according to claim 1, wherein the light emitting unit comprises a light emitting layer capable of emitting red light, a light emitting layer capable of emitting green light, and a light emitting layer capable of emitting blue light and
wherein the thickness of the light emitting layer capable of emitting blue light is from 40 to 70 nm.

12. An organic electroluminescent element according to claim 11, wherein the thickness of the light emitting layer capable of emitting green light is from 10 to 30 nm.

* * * * *